US012698561B2

(12) United States Patent
Vasquez et al.

(10) Patent No.: US 12,698,561 B2
(45) Date of Patent: Aug. 4, 2026

(54) PURGE RING FOR REDUCED SUBSTRATE BACKSIDE DEPOSITION

(71) Applicant: Applied Materials, Inc., Santa Clara, CA (US)

(72) Inventors: Geraldine Vasquez, San Jose, CA (US); Yi Xu, San Jose, CA (US); Dien-yeh Wu, San Jose, CA (US); Aixi Zhang, Sunnyvale, CA (US); Jallepally Ravi, San Ramon, CA (US); Yu Lei, Belmont, CA (US)

(73) Assignee: Applied Materials Inc., Santa Clara, CA (US)

( * ) Notice: Subject to any disclaimer, the term of this patent is extended or adjusted under 35 U.S.C. 154(b) by 349 days.

(21) Appl. No.: 18/220,408

(22) Filed: Jul. 11, 2023

(65) Prior Publication Data

US 2024/0018648 A1     Jan. 18, 2024

Related U.S. Application Data

(60) Provisional application No. 63/389,287, filed on Jul. 14, 2022.

(51) Int. Cl.
| | | |
|---|---|---|
| *C23C 16/44* | (2006.01) | |
| *C23C 16/458* | (2006.01) | |
| *H01J 37/32* | (2006.01) | |

(52) U.S. Cl.
CPC ...... *C23C 16/4408* (2013.01); *C23C 16/4586* (2013.01); *H01J 37/32798* (2013.01); *H01J 2237/3321* (2013.01)

(58) Field of Classification Search
CPC ...... C23C 16/455; C23C 16/485; H01L 21/67
See application file for complete search history.

(56) References Cited

U.S. PATENT DOCUMENTS

| | | | |
|---|---|---|---|
| D338,621 S | | 8/1993 | Balson |
| 5,326,725 A | * | 7/1994 | Sherstinsky .......... C23C 16/042 |
| | | | 118/503 |

(Continued)

FOREIGN PATENT DOCUMENTS

| | | |
|---|---|---|
| JP | 2023000481 | 7/2025 |
| JP | 2024001810 | 7/2025 |

(Continued)

OTHER PUBLICATIONS

PCT International Search Report and Written Opinion for PCT/US2023/027648 dated Nov. 3, 2023.

(Continued)

*Primary Examiner* — Jason L Vaughan
(74) *Attorney, Agent, or Firm* — Moser Taboada

(57) ABSTRACT

Embodiments of a purge ring for use in a process chamber are provided herein. In some embodiments, a purge ring includes: an annular body having an inner portion and an outer portion, wherein the inner portion includes an inner surface of the annular body, the inner surface comprising a first inner sidewall, a second inner sidewall, and a third inner sidewall, wherein the inner portion has an upper inner notch that defines the first inner sidewall and a lower inner notch that defines the second inner sidewall, wherein a third inner sidewall is disposed between the first inner sidewall and the second inner sidewall, and wherein the first inner sidewall and the second inner sidewall are disposed radially outward of the third inner sidewall.

20 Claims, 9 Drawing Sheets

(56) References Cited

U.S. PATENT DOCUMENTS

| | | | |
|---|---|---|---|
| D379,588 S | 6/1997 | Pledger et al. | |
| 5,805,408 A | 9/1998 | Maraschin et al. | |
| 5,985,033 A * | 11/1999 | Yudovsky | H01L 21/68735 |
| | | | 118/728 |
| 6,033,480 A * | 3/2000 | Chen | C23C 16/4583 |
| | | | 118/715 |
| 6,039,836 A | 3/2000 | Dhindsa et al. | |
| 6,068,548 A | 5/2000 | Vote | |
| 6,159,299 A * | 12/2000 | Koai | H01L 21/67017 |
| | | | 118/728 |
| 6,296,712 B1 * | 10/2001 | Guo | C23C 16/45521 |
| | | | 118/500 |
| D557,226 S | 12/2007 | Uchino | |
| D559,994 S | 1/2008 | Nagakubo et al. | |
| 7,459,057 B2 | 12/2008 | Zuniga | |
| 7,632,356 B2 * | 12/2009 | Tomita | H01L 21/67017 |
| | | | 118/728 |
| D699,200 S | 2/2014 | Nagakubo | |
| D709,536 S | 7/2014 | Yoshimura | |
| D709,537 S | 7/2014 | Kuwabara et al. | |
| D709,538 S | 7/2014 | Mizukami | |
| D709,539 S | 7/2014 | Kuwabara et al. | |
| 8,790,499 B2 * | 7/2014 | Young | H01J 37/3408 |
| | | | 204/298.11 |
| D729,730 S | 5/2015 | Gillespie-Brown | |
| 9,123,661 B2 | 9/2015 | Kellogg | |
| D770,992 S | 11/2016 | Tauchi et al. | |
| D783,922 S | 4/2017 | Kirkland | |
| D793,976 S | 8/2017 | Fukushima | |
| D797,691 S | 9/2017 | Joubert | |
| D799,437 S | 10/2017 | Nabeya | |
| D810,705 S | 2/2018 | Krishnan | |
| D827,592 S | 9/2018 | Ichino et al. | |
| D870,314 S | 12/2019 | Isozaki | |
| D871,609 S | 12/2019 | Isozaki et al. | |
| D888,903 S | 6/2020 | Gunther | |
| D891,382 S | 7/2020 | Koppa | |
| D895,777 S | 9/2020 | Chase | |
| D933,725 S | 10/2021 | Koppa et al. | |
| D934,315 S | 10/2021 | Lavitsky | |
| 11,136,665 B2 | 10/2021 | Bois et al. | |
| D954,986 S | 6/2022 | Nakatani | |
| 11,417,561 B2 | 8/2022 | Raj et al. | |
| D979,524 S | 2/2023 | Perry | |
| D992,614 S | 7/2023 | Sasaki | |
| D992,615 S | 7/2023 | Sasaki | |
| D1,005,245 S | 11/2023 | Nakatani | |
| D1,038,049 S | 8/2024 | Chowdhury | |
| D1,051,867 S | 11/2024 | Perry | |
| D1,066,275 S | 3/2025 | Rane | |
| D1,066,440 S | 3/2025 | Li | |
| 2004/0003780 A1 | 1/2004 | Yudovsky et al. | |
| 2004/0077167 A1 | 4/2004 | Willis | |
| 2005/0016684 A1 | 1/2005 | Sun et al. | |
| 2005/0277375 A1 | 12/2005 | Young | |
| 2006/0102076 A1 | 5/2006 | Smith et al. | |
| 2011/0092142 A1 | 4/2011 | Frank, Jr. | |
| 2012/0263569 A1 | 10/2012 | Priddy | |
| 2012/0309276 A1 | 12/2012 | Kim | |
| 2016/0002788 A1 | 1/2016 | Nal | |
| 2018/0142340 A1 | 5/2018 | Johanson et al. | |
| 2018/0264621 A1 | 9/2018 | Yoo | |
| 2020/0090915 A1 | 3/2020 | Kerschbaumer | |
| 2022/0415621 A1 | 12/2022 | Cho | |

FOREIGN PATENT DOCUMENTS

| | | |
|---|---|---|
| TW | 112300168 | 8/2024 |
| TW | 113300619 | 12/2024 |

OTHER PUBLICATIONS

Purge Ring,https://pressureproducts.com/mobile/accessories-and-spare-parts/purge-ring/,2025. (Year: 2025).

Purge Lantern Ring,https://kochek.com/product/purge-lantern-ring/ 2025. (Year: 2025).

* cited by examiner

PURGE RING FOR REDUCED SUBSTRATE BACKSIDE DEPOSITION

CROSS-REFERENCE TO RELATED APPLICATIONS

This application claims benefit of U.S. provisional patent application Ser. No. 63/389,287, filed Jul. 14, 2022, which is herein incorporated by reference in its entirety.

FIELD

Embodiments of the present disclosure generally relate to substrate processing equipment.

BACKGROUND

Deposition process chambers are widely used in the semiconductor processing industry to deposit thin layers of materials onto substrates. For example, chemical vapor deposition (CVD) chambers may be used to deposit thin layers of materials via a chemical reaction of one or more process gases. During deposition, the one or more process gases may diffuse to a backside of the substrate and result in unwanted backside deposition, substrate peeling, and particle issues.

Accordingly, the inventors have provided herein embodiments of improved purge rings for use in deposition chambers.

SUMMARY

Embodiments of a purge ring for use in a process chamber are provided herein. In some embodiments, a purge ring includes: an annular body having an inner portion and an outer portion, wherein the inner portion includes an inner surface of the annular body, the inner surface comprising a first inner sidewall, a second inner sidewall, and a third inner sidewall, wherein the inner portion has an upper inner notch that defines the first inner sidewall and a lower inner notch that defines the second inner sidewall, wherein a third inner sidewall is disposed between the first inner sidewall and the second inner sidewall, and wherein the first inner sidewall and the second inner sidewall are disposed radially outward of the third inner sidewall.

In some embodiments, a process kit for use in a process chamber includes a purge ring comprising an annular body having an inner portion and an outer portion, wherein the inner portion has an upper inner notch that defines a first inner sidewall and an inner upper wall of the annular body that extends horizontally, and wherein the inner portion has a lower inner notch that defines a second inner sidewall and inner lower wall of the annular body, wherein a third inner sidewall is disposed between the first inner sidewall and the second inner sidewall, wherein the second inner sidewall is disposed radially outward of the first inner sidewall, wherein a first height of the first inner sidewall is less than a second height of the second inner sidewall, wherein the first height is less than a third height of the third inner sidewall.

In some embodiments, a substrate support includes: a pedestal configured to support a substrate and having one or more purge gas inlets; and a purge ring comprising an annular body disposed on an outer ledge of the pedestal radially outward of the one or more purge gas inlets, the purge ring having an inner portion and an outer portion, wherein the inner portion has an upper inner notch that defines a first inner sidewall and inner upper wall of the annular body and a lower inner notch that defines a second inner sidewall and inner lower wall of the annular body, wherein a third inner sidewall is disposed between the first inner sidewall and the second inner sidewall, wherein the third inner sidewall is disposed radially inward of the first inner sidewall and the second inner sidewall, wherein a first height of the first inner sidewall is less than a second height of the second inner sidewall, and wherein the pedestal and the purge ring, together, define a gas flow path along the inner lower wall, third inner sidewall, and inner upper wall of the purge ring.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
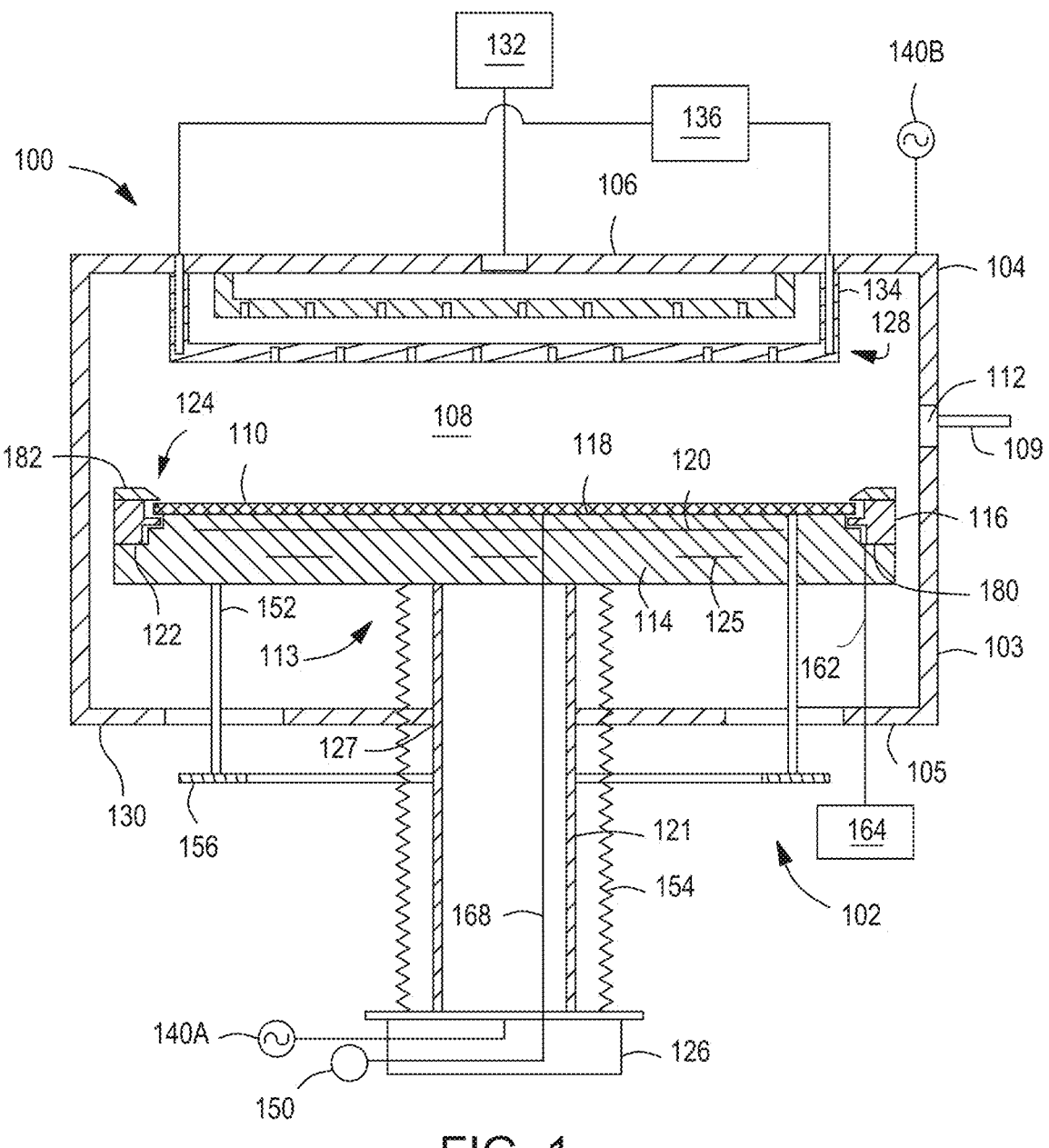
FIG. 1 depicts a schematic side view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a purge ring for use in a process chamber are provided herein. In some embodiments, the process chamber is a deposition chamber such as a CVD chamber. In some embodiments, the CVD chamber is configured for tungsten deposition. The purge ring is designed to increase an edge purge flow speed along a backside of a substrate to advantageously prevent front side gases from reaching a backside of the substrate.

FIG. 1 depicts a schematic side view of a process chamber 100 in accordance with at least some embodiments of the present disclosure. The process chamber 100 generally includes a chamber body 104 with sidewalls 103, a bottom 105 and a lid assembly 106 that encloses an interior volume 108. A substrate support 102 is at least partially disposed in the interior volume 108 and can support a substrate 110 that has been transferred to the interior volume 108 through a port 112 formed in the chamber body 104. A process kit 124 is disposed in the interior volume 108 and includes a purge ring 116 disposed about the substrate 110, when the substrate 110 is present. In some embodiments, the process kit 124 includes a shadow ring 182 disposed on a purge ring 116.

The interior volume 108 may be in selective fluid communication with a vacuum system 130 to control pressures therein. A showerhead assembly 128 may be coupled to a process gas source 132 to provide process gases to the interior volume 108 for depositing materials onto the substrate 110. The showerhead assembly 128 may also include a temperature control element 134 for controlling the temperature of the showerhead assembly 128. The temperature control element 134 may be a fluid channel that is in fluid communication with a coolant source 136.

The substrate support 102 includes an upper support assembly 113, such as a pedestal 114. In some embodiments, the pedestal 114 includes a thermal element 120. The pedestal 114 includes a support surface 118 that is adapted to contact (or be in proximity to) a major surface of the substrate 110 during processing. Thus, the pedestal 114 serves as a primary supporting structure for the substrate 110 in the process chamber 100. The pedestal 114 may be made of a conductive material and function as a ground path for RF power from a power element 140B distributed by the showerhead assembly 128. Thus, the process chamber 100 may perform a deposition or etch process utilizing RF or DC plasmas.

The pedestal 114 may include a thermal element 120 to control the temperature of the substrate 110 during processing. The thermal element 120 can be, for example, a heater or cooler that is positioned on top of the pedestal 114 or within the pedestal. The heater or cooler can be a separate component that is coupled to the top of the pedestal 114 or can be an integral part of the pedestal 114. For example, in some embodiments, the pedestal 114 comprises a heater plate with the thermal element 120 disposed therein. In some embodiments, the thermal element 120 comprises one or more resistive heating elements.

In some embodiments, the thermal element 120 is embedded within the pedestal body (as shown in FIG. 1). In some embodiments, the embedded thermal element 120 may be a heating or cooling element or channel, utilized to apply thermal energy to the pedestal 114 body that is absorbed by the substrate 110. Other elements may be disposed on or embedded within the pedestal 114, such as one or more electrodes, sensors, and/or vacuum ports for vacuum chucking. The temperature of the substrate 110 may be monitored by one or more sensors (not shown). The embedded thermal element 120 may be zone controlled such that temperature at different areas of the pedestal 114 body may be individually heated or cooled.

The pedestal 114 can be coupled to an actuator 126 via a shaft 121 that provides one or more of vertical movement (in the z-axis), rotational movement (about axis A) and may also provide angular movement (relative to axis A). Vertical movement may be provided by the actuator 126 to allow the substrate 110 to be transferred between the purge ring 116 and the support surface 118. The shaft 121 passes through the bottom 105 of the processing chamber 100 via opening 127. An isolated processing environment can be preserved by bellows 154 surrounding opening 127 and connected to a portion of the shaft 121.

The purge ring 116 may circumscribe (i.e., surround) the pedestal 114 such that a lower surface of the substrate 110 would be supported by the pedestal 114. In some embodiments, the purge ring 116 is shown supported by a peripheral shoulder 122 formed around the circumference of the pedestal 114. Those skilled in the art will understand that the embodiment shown is merely representative of one possible configuration and should not be taken as limiting the scope of the disclosure.

The substrate 110 may be brought into the interior volume 108 by a robot 109 through port 112 in the sidewall 103 of the process chamber 100. The port 112 can be, for example, a slit valve. The lift pins 152 can pass through openings in the body of the pedestal 114 and thermal element 120. When not in use, the lift pins 152 can be lowered to be out of the way during processing. The lift pins 152 can be part of a lift pin assembly 156 that is connected to the shaft 121 so that the lift pin assembly 156 rotates with the shaft 121 and remain aligned with the openings in the pedestal 114. As shown in FIG. 1, the lift pins 152 are lowered, which lowers the substrate 110 onto the support surface 118 proximate the purge ring 116.

In some embodiments, a purge line 162 may extend from a purge gas source 164 to an upper surface 180 of the pedestal 114. The purge line 162 is configured to flow a purge gas through a gap between the purge ring 116 and the substrate 110. In some embodiments, the substrate 110 may be retained via a vacuum chuck. For example, pump 150 may be coupled to a vacuum line 168 that extends from the pump 150 to the support surface 118 to vacuum chuck the substrate 110 against the support surface 118. The purge gas may be any suitable inert gas, for example, argon, nitrogen, or the like. In some embodiments, the pedestal 114 may be an electrostatic chuck and the pedestal 114 may include one or more electrodes 125 (as shown in FIG. 1). For example, the pedestal 114 may be coupled to a power element 140A that may be a voltage source providing power to the one or more electrodes 125. The voltage source may be a radio frequency (RF) controller or a direct current (DC) controller.

Figure 2:
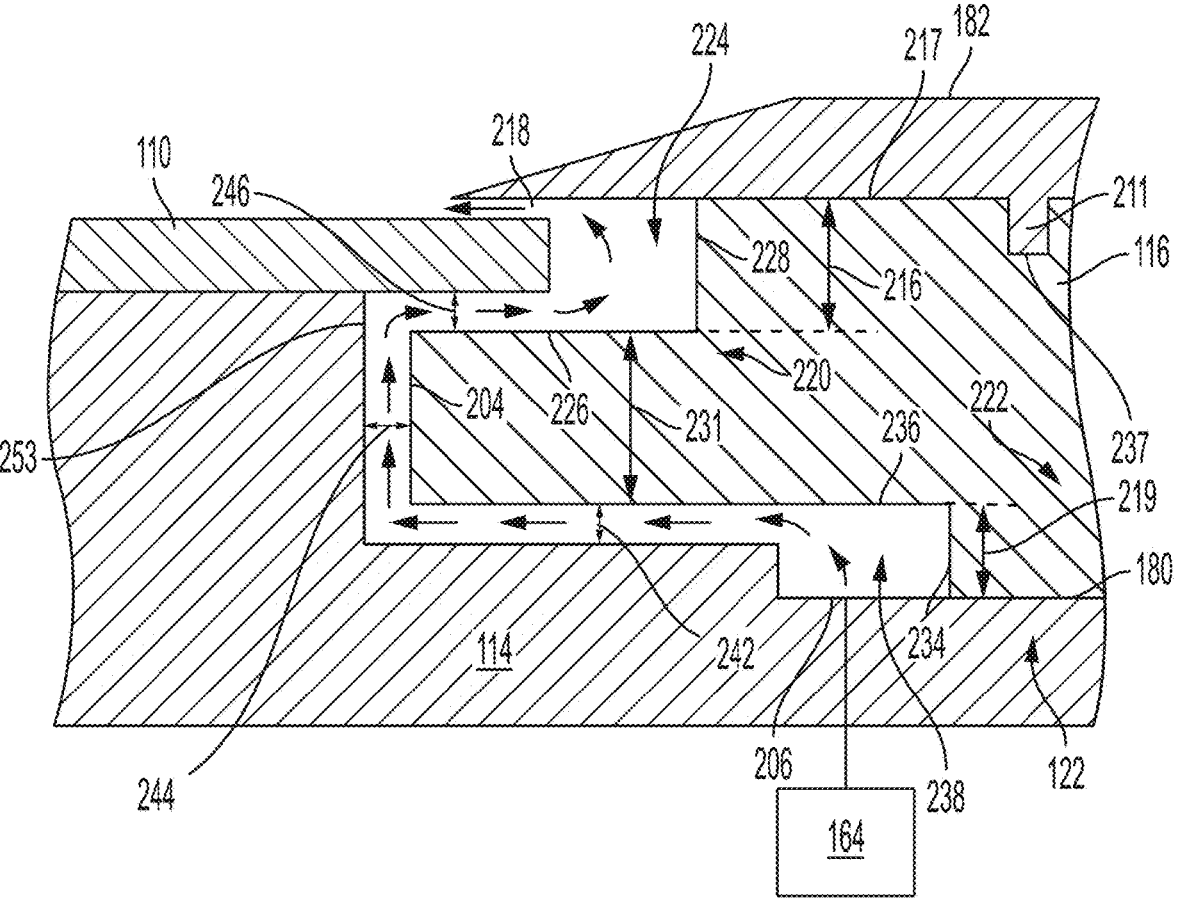
FIG. 2 depicts a schematic cross-sectional view of a portion of a substrate support and process kit in accordance with at least some embodiments of the present disclosure.

FIG. 2 depicts a schematic cross-sectional view of a portion of a substrate support 102 and process kit 124 in accordance with at least some embodiments of the present disclosure. The substrate support 102 includes the pedestal 114, the pedestal 114 having one or more purge gas inlets 206 for flowing purge gas through purge line 162. The purge ring 116 generally comprises an annular body disposed on the peripheral shoulder 122 of the pedestal 114 radially outward of the one or more purge gas inlets 206. The purge ring 116 includes an inner portion 220 and an outer portion 222. In some embodiments, the inner portion 222 has an upper inner notch 224 that defines a first inner sidewall 228 and inner upper wall 226 of the annular body. In some embodiments, the inner upper wall 226 of the annular body extends horizontally. In some embodiments, the shadow ring 182 is disposed on the purge ring 116 and extends over the upper inner notch 224. In some embodiments, the purge ring 116 includes a plurality of openings 237 configured to receive alignment pins 211 of the shadow ring 182 to align the shadow ring 182 with the purge ring 116.

In some embodiments, the inner portion 222 has a lower inner notch 232 that defines a second inner sidewall 234 and inner lower wall 236 of the annular body. In some embodiments, a third inner sidewall 204 is disposed between the first inner sidewall 228 and the second inner sidewall 234. In some embodiments, the third inner sidewall 204 is disposed radially inward of the first inner sidewall 228 and the second inner sidewall 234. In some embodiments, a first height 216 of the first inner sidewall 228 is less than a second height 219 of the second inner sidewall 234. In some embodiments, the first height 216 is less than a third height 231 of the third inner sidewall 204. In some embodiments, the third height 231 is greater than the second height 219 and the first height 216. In some embodiments, the inner upper wall 226 extends horizontally from the third inner sidewall 204 to the first inner sidewall 228.

The pedestal 114 and the purge ring 116, together, define a gas flow path between the pedestal 114 and the inner lower wall 236, third inner sidewall 204, and inner upper wall 226 of the purge ring 116. In some embodiments, the pedestal 114 includes a second shoulder 181 disposed radially inward from and raised from the peripheral shoulder 122. In some embodiments, a first gap 242 between the inner lower wall 236 and the second shoulder 181 is about 0.01 to about 0.06 inches. In some embodiments, a second gap 244 between the third inner sidewall 204 and opposing outer surface 253 of the pedestal 114 is about 0.01 to about 0.04 inches. In some embodiments, a third gap 246 between the inner upper wall 226 and the substrate 110 is about is about 0.01 to about 0.04 inches.

The sizing of the first gap 242, the second gap 244, and the third gap 246 advantageously creates a high-speed edge purge flow across a lower surface of the substrate 110, preventing front side gases from above the substrate 110 to diffuse to the lower surface of the substrate which may cause unwanted deposition. In some embodiments, the gas flow path is further defined between the inner upper wall 226 and a bottom surface 217 of the shadow ring 182 and between the bottom surface 217 and upper surface of the substrate 110. In some embodiments, a fourth gap 218 between the bottom surface 217 and the upper surface of the substrate 110 is about 4 mil to about 10 mil, for example, about 4 mil to about 6 mil.

Figure 3:
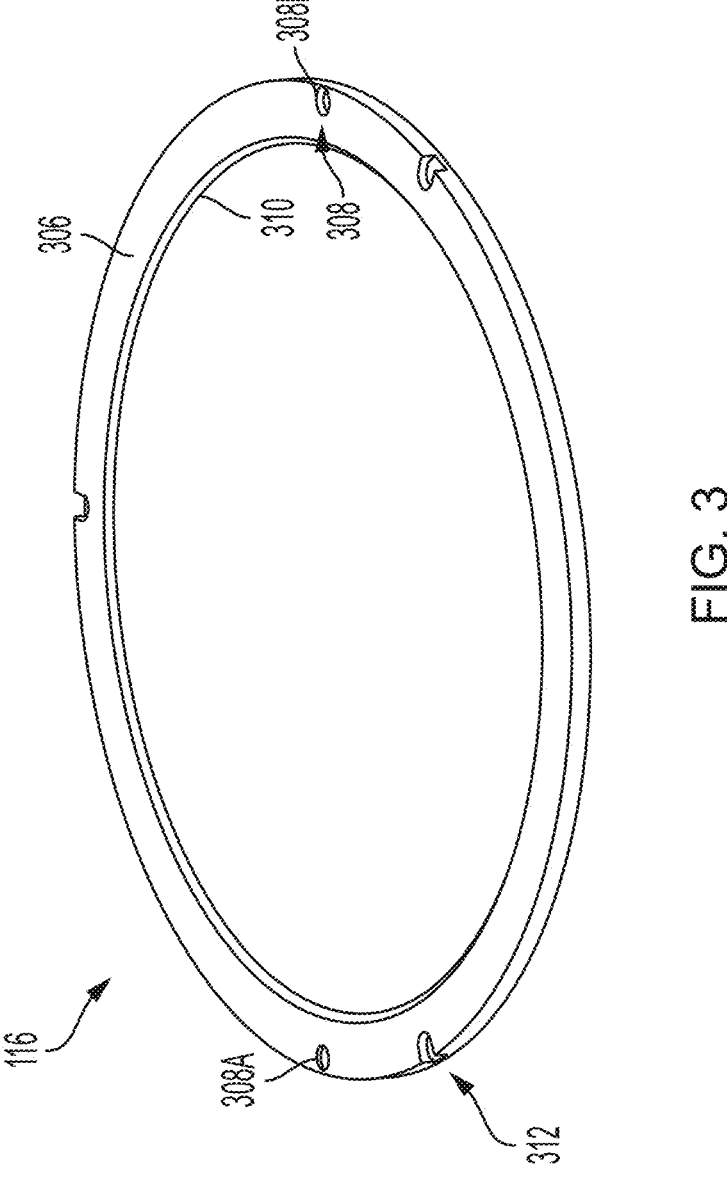
FIG. 3 depicts an isometric view of a purge ring in accordance with at least some embodiments of the present disclosure.
Figure 4:
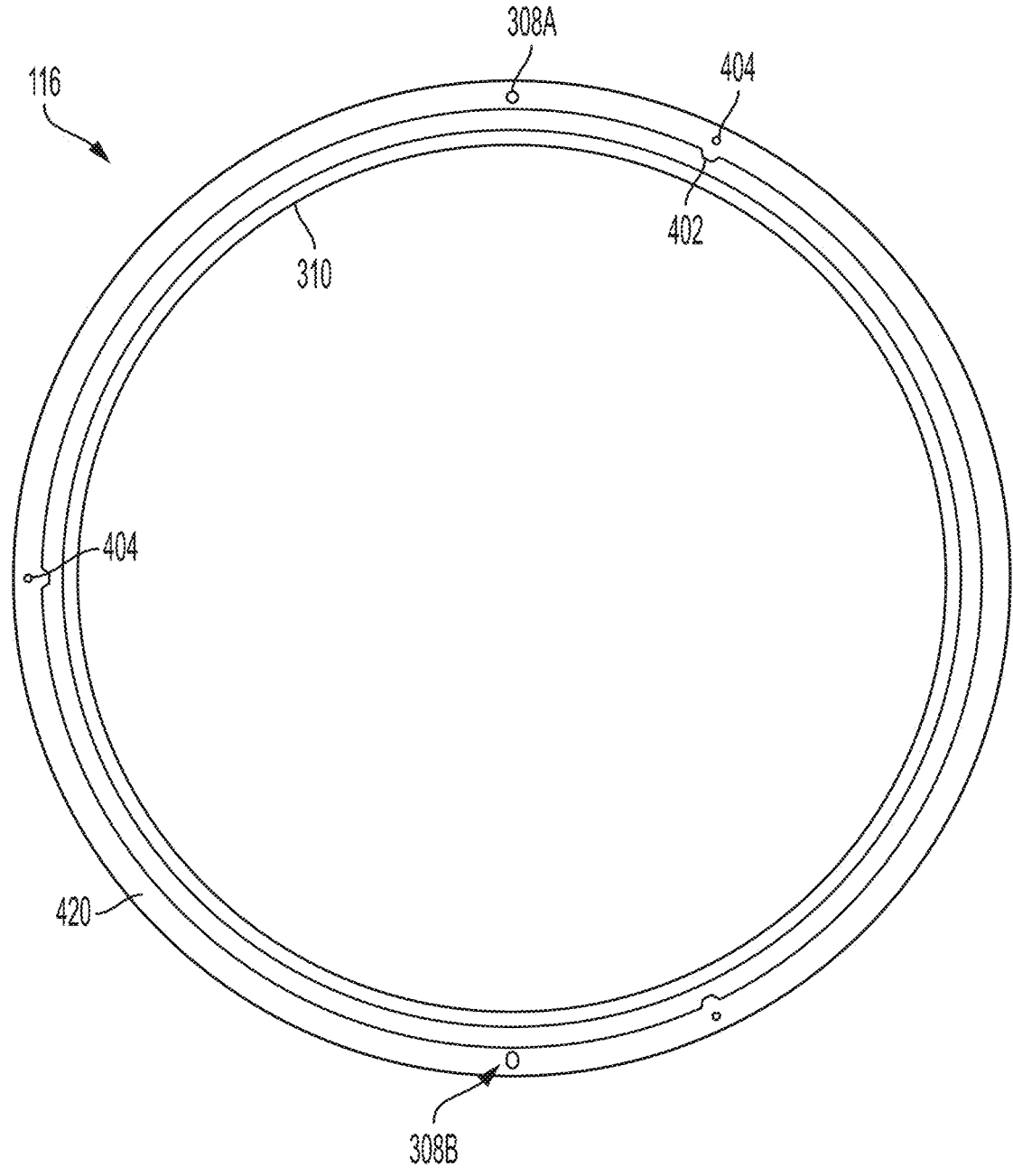
FIG. 4 depicts a bottom view of a purge ring in accordance with at least some embodiments of the present disclosure.

FIG. 3 depicts an isometric view of a purge ring in accordance with at least some embodiments of the present disclosure. FIG. 4 depicts a bottom view of a purge ring in accordance with at least some embodiments of the present disclosure. The purge ring 116 generally comprises an annular body having a central opening 310. In some embodiments, the central opening 310 has a diameter of about 10 inches to about 13 inches. An outer diameter of the annular body may be about 12 to about 15 inches. In some embodiments, an upper surface 306 of the annular body is substantially flat. In some embodiments, the annular body includes a plurality of protrusions 402 for aligning the annular body to a first chamber component. In some embodiments, the first chamber component may be the pedestal 114. The plurality of protrusions 402 may be disposed on a lower surface 420 of the purge ring 116. In some embodiments, the upper surface 306 may include a plurality of recesses 312 aligned with the plurality of protrusion 402 on the lower surface 420. Each of the plurality of recesses 312 may include an opening 404 extending from a lower surface of the plurality of recesses 312 to the lower surface 420. The opening 404 may be used to couple the purge ring 116 to the first chamber component.

In some embodiments, the purge ring 116 includes a plurality of openings 308 for aligning the annular body to a second chamber component. In some embodiments, the second chamber component is the shadow ring 182. In some embodiments, the plurality of openings 308 may include a first opening 308A having a first size and a second opening 308B having a second size. In some embodiments, the first size is different than the second size. For example, the first size comprises a diameter smaller than a diameter of the second size.

Figure 5:
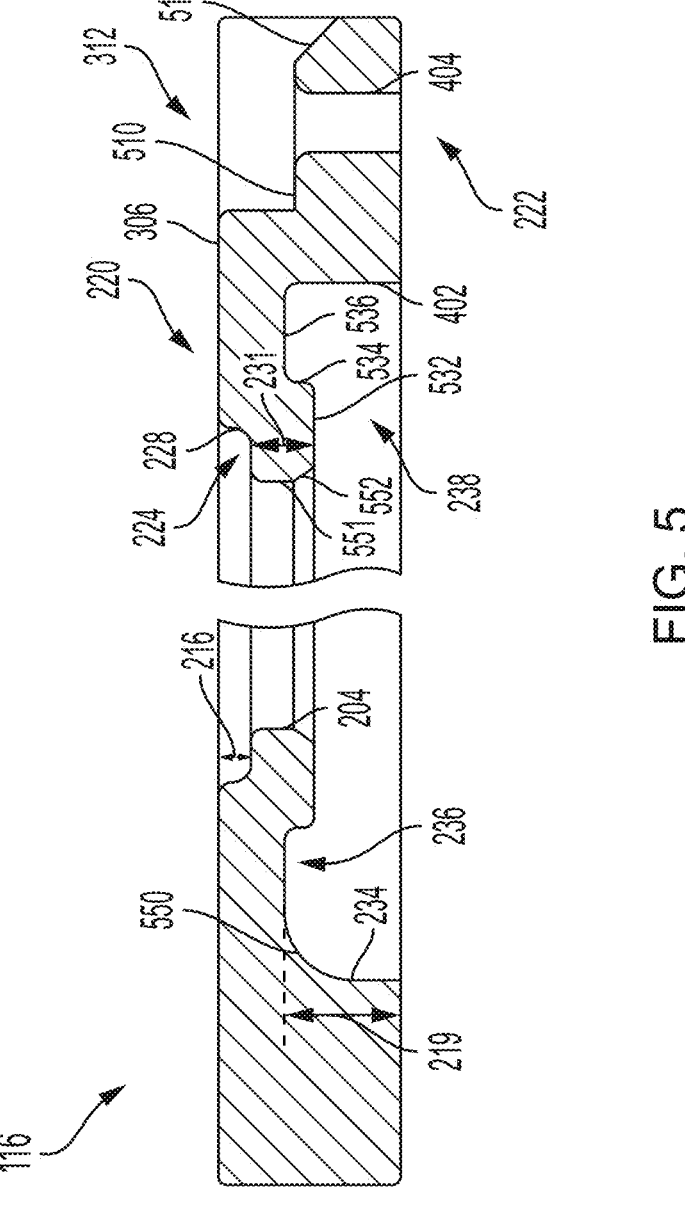
FIG. 5 depicts a cross-sectional view of a purge ring in accordance with at least some embodiments of the present disclosure.

FIG. 5 depicts a cross-sectional view of a purge ring 116 taken along an axis extending through one of the plurality of recesses 312 in accordance with at least some embodiments of the present disclosure. In some embodiments, the plurality of recesses 312 define a horizontal surface 510 and an angled surface 512 extending downward and radially outward from the horizontal surface 510. In some embodiments, the lower inner notch 238 defines the inner lower wall 236 having a first portion 532 and a second portion 536, where the second portion 536 extends along a horizontal plane that is different than a horizontal plane along which the first portion 532 extends. In some embodiments, the second portion 536 is disposed closer to the upper surface 306 of the annular body than the first portion 532. In some embodiments, a step 534 between the first portion 532 and the second portion 536 is disposed radially outward of the first inner sidewall 228.

In some embodiments, the lower inner notch 238 includes rounded sidewalls 550 between the inner lower wall 236 and the second inner sidewall 234. In some embodiments, the third height 231 between the upper inner notch 224 and the lower inner notch 238 is greater than the first height 216 and is less than the second height 219. In some embodiments, the first height is about 0.3 to about 0.6 inches. In some embodiments, the third height 231 is about 0.06 to about 0.12 inches. In some embodiments, the third inner sidewall 204 includes an upper portion 551 and a lower portion 552 extending radially outward and downward from the upper portion 551.

Figure 6:
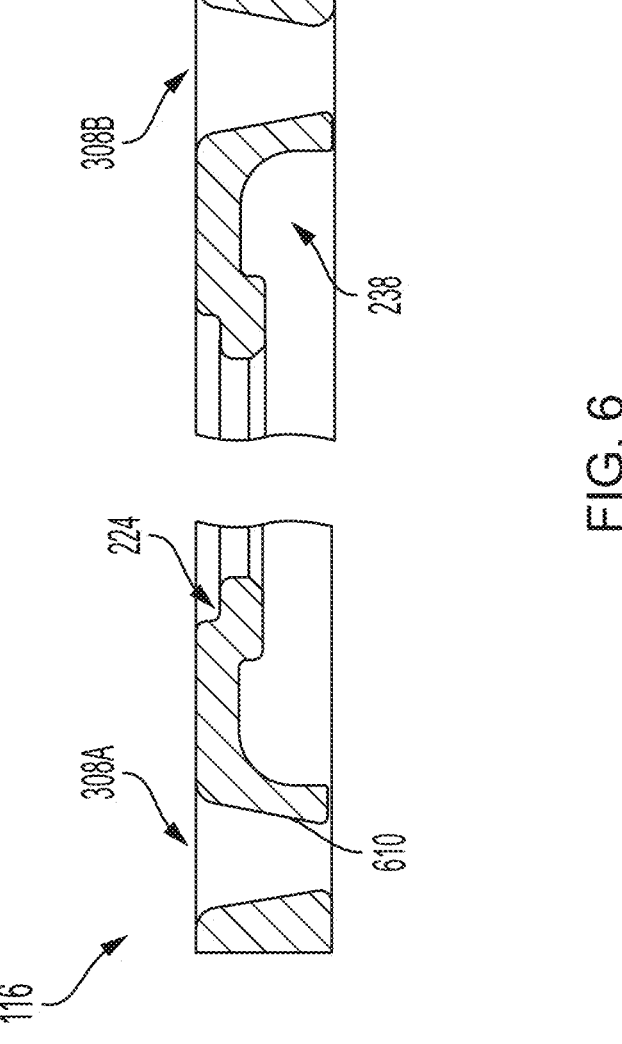
FIG. 6 depicts a cross-sectional view of a purge ring in accordance with at least some embodiments of the present disclosure.

FIG. 6 depicts a cross-sectional view of a purge ring 116 taken along an axis extending through the plurality of openings 308 in accordance with at least some embodiments of the present disclosure. The plurality of openings 308 may comprise two openings that are diametrically opposed. In some embodiments, the plurality of openings 308 have angled sidewalls 610 to receive alignment pins 211 of the shadow ring 182.

Figure 7:
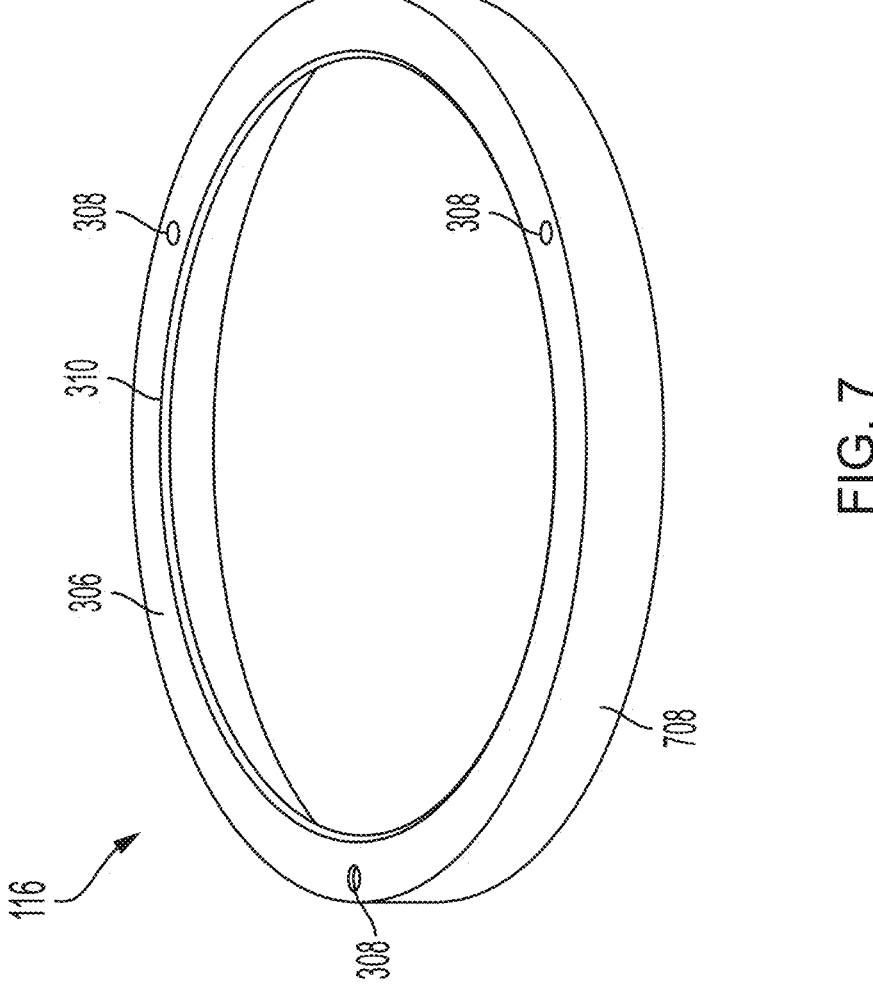
FIG. 7 depicts an isometric view of a purge ring in accordance with at least some embodiments of the present disclosure.
Figure 8:
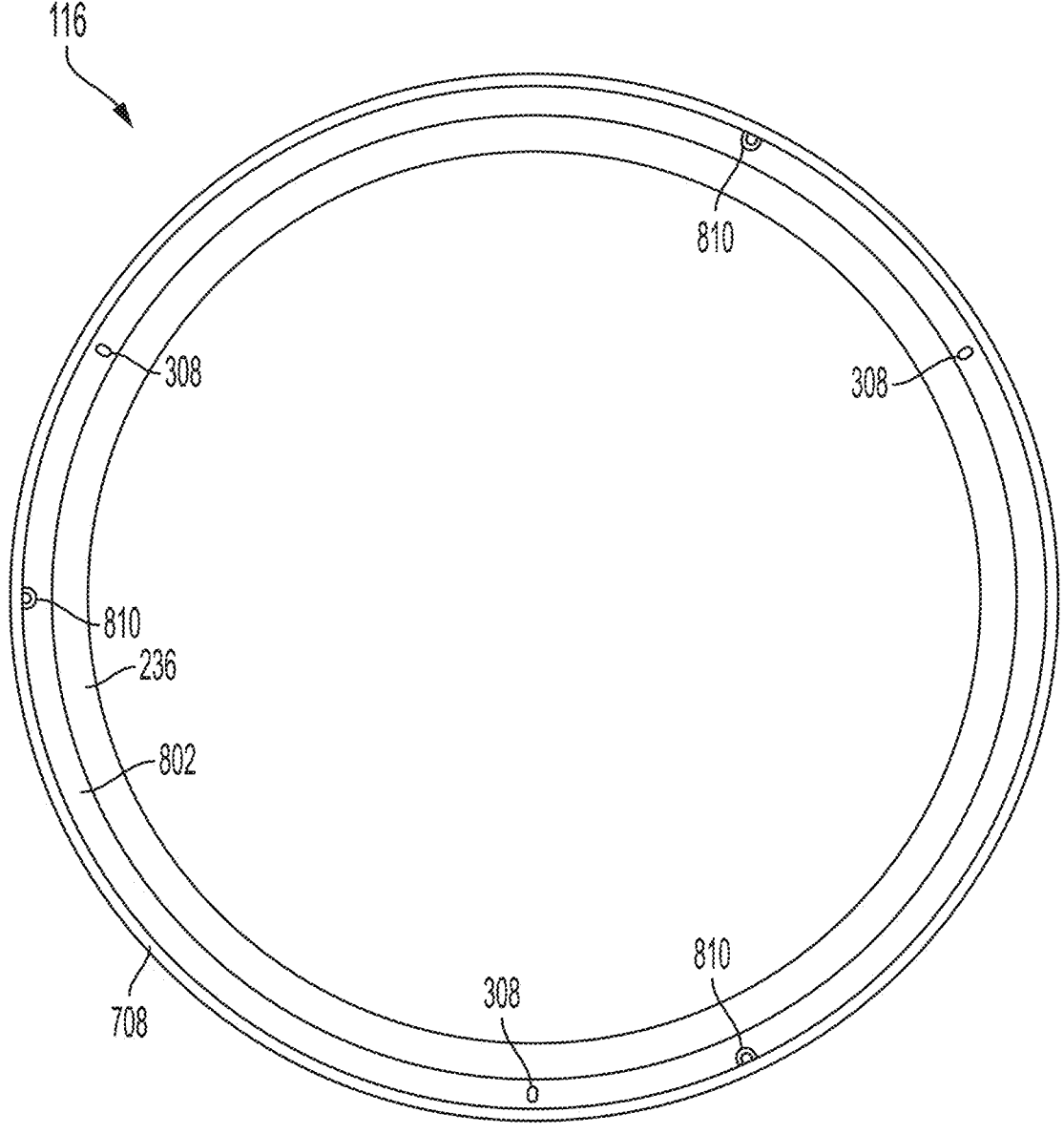
FIG. 8 depicts a bottom view of a purge ring in accordance with at least some embodiments of the present disclosure.

FIG. 7 depicts an isometric view of a purge ring in accordance with at least some embodiments of the present disclosure. FIG. 8 depicts a bottom view of a purge ring in accordance with at least some embodiments of the present disclosure. In some embodiments, the plurality of openings 308 for aligning the purge ring 116 with the shadow ring 182 comprise three openings. In some embodiments, the plurality of openings 308 are the same size and disposed axisymmetrically about the purge ring 116. The plurality of openings 308 may be circular, oval, or any other suitable shape. In some embodiments, the outer portion 222 of the purge ring 116 includes an outer leg 708 extending from a lower surface 802 of the outer portion 222. In some embodiments, a plurality of protrusions 810 for aligning the annular body of the purge ring 116 to the first chamber component extend from the lower surface 802.

Figure 9:
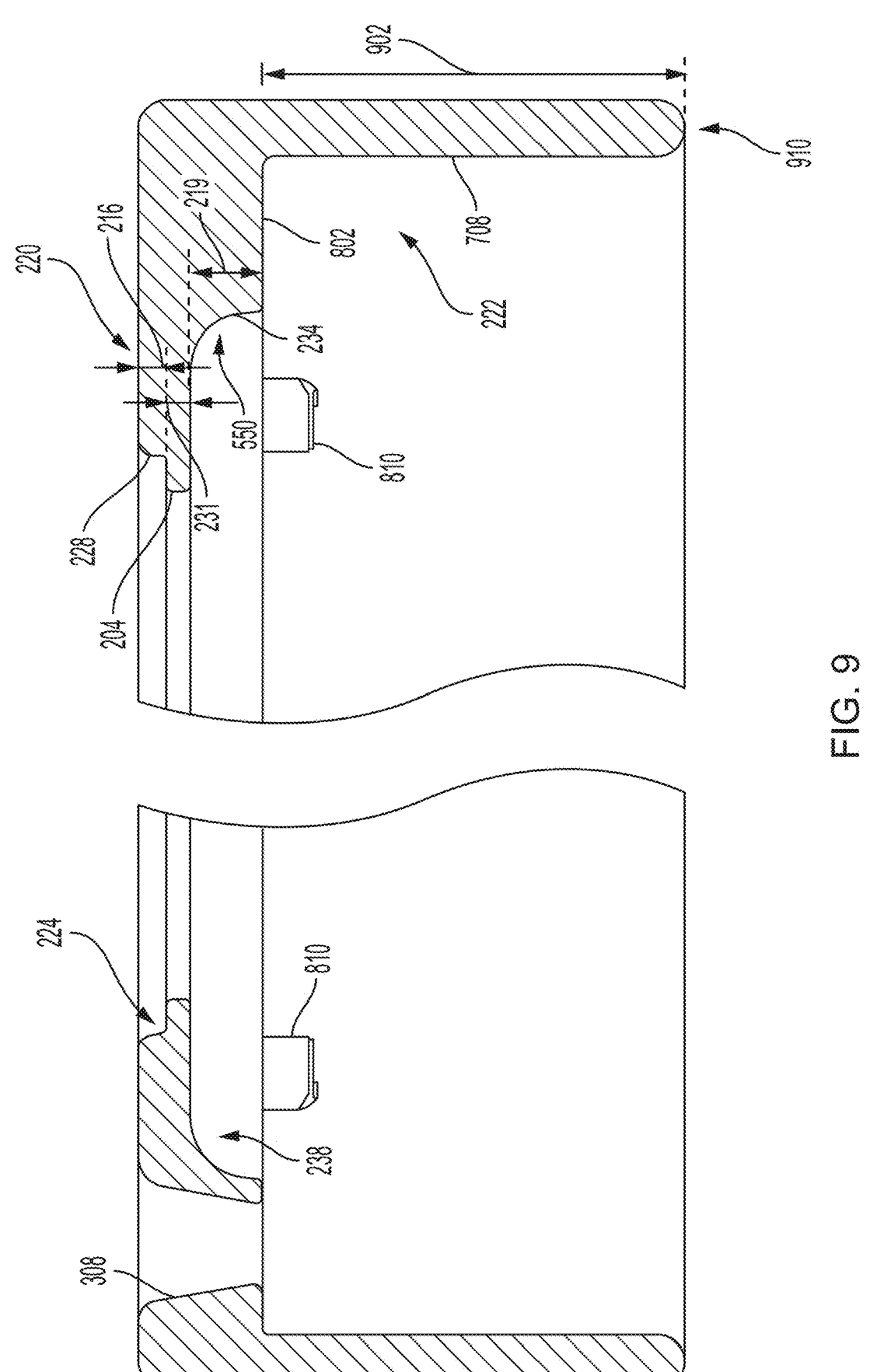
FIG. 9 depicts a cross-sectional view of a purge ring in accordance with at least some embodiments of the present disclosure.

FIG. 9 depicts a cross-sectional view of a purge ring 116 in accordance with at least some embodiments of the present disclosure. In some embodiments, the outer leg 708 has a height 902 greater than a total of the first height 216, the second height 219, and the third height 231. In some embodiments, the height 902 is about 0.9 to about 1.3 inches. In some embodiments, a lower surface 910 of the outer leg 708 is rounded. In some embodiments, an outer surface of the outer leg 708 is coplanar with an outer surface of the outer portion 222.

While the foregoing is directed to embodiments of the present disclosure, other and further embodiments of the disclosure may be devised without departing from the basic scope thereof.

The invention claimed is:

1. A purge ring for use in a process chamber, comprising:
an annular body having an inner portion and an outer portion, wherein the inner portion includes an inner surface of the annular body, the inner surface comprising a first inner sidewall, a second inner sidewall, and a third inner sidewall, wherein the inner portion has an upper inner notch that defines the first inner sidewall and a lower inner notch that defines the second inner sidewall, wherein the third inner sidewall is disposed between the first inner sidewall and the second inner sidewall, wherein the first inner sidewall and the second inner sidewall are disposed radially outward of the third inner sidewall, and wherein an inner diameter of the purge ring along the second inner sidewall increases from the third inner sidewall to a lowermost surface of the purge ring.

2. The purge ring of claim 1, wherein a lower surface of the annular body includes a plurality of protrusions for aligning the annular body to a chamber component.

3. The purge ring of claim 1, wherein the outer portion includes a plurality of openings extending completely through the outer portion for aligning the annular body to a second chamber component.

4. The purge ring of claim 3, wherein the plurality of openings include a first opening having a first size and a second opening having a second size different than the first size.

5. The purge ring of claim 1, wherein a first height of the first inner sidewall is less than a second height of the second inner sidewall, and wherein a third height between the upper inner notch and the lower inner notch is greater than the first height and is less than the second height.

6. The purge ring of claim 1, wherein the outer portion includes an outer leg extending from a lower surface of the outer portion.

7. The purge ring of claim 1, wherein the lower inner notch includes rounded sidewalls.

8. The purge ring of claim 1, wherein a first height of the first inner sidewall is about 0.3 to about 0.6 inches.

9. The purge ring of claim 1, wherein the lower inner notch defines an inner lower wall having a first portion and a second portion, wherein the second portion is disposed closer to an upper surface of the annular body than the first portion.

10. A process kit for use in a process chamber, comprising:
a purge ring comprising an annular body having an inner portion and an outer portion, wherein the inner portion has an upper inner notch that defines a first inner sidewall and an inner upper wall of the annular body that extends horizontally, and wherein the inner portion has a lower inner notch that defines a second inner sidewall and inner lower wall of the annular body, wherein a third inner sidewall is disposed between the first inner sidewall and the second inner sidewall, wherein the second inner sidewall is disposed radially outward of the first inner sidewall, wherein a first height of the first inner sidewall is less than a second height of the second inner sidewall, wherein the first height is less than a third height of the third inner sidewall, wherein an upper surface of the annular body includes a plurality of recesses, and wherein each of the plurality of recesses includes an opening extending from a lower surface of the recess to the lower surface.

11. The process kit of claim 10, wherein:
the outer portion includes an outer leg extending from a lower surface of the outer portion, or
the lower inner notch defines an upper surface having a first portion and a second portion, wherein the second portion extends along a horizontal plane that is different than a horizontal plane along which the first portion extends.

12. The process kit of claim 10, wherein the upper surface of the annular body is substantially flat.

13. The process kit of claim 10, wherein the annular body includes a plurality of protrusions for aligning the annular body to a first chamber component and a plurality of openings for aligning the annular body to a second chamber component.

14. The process kit of claim 10, further comprising a shadow ring disposed on the purge ring and extending over the upper inner notch.

15. A substrate support, comprising:
a pedestal configured to support a substrate and having one or more purge gas inlets; and
a purge ring comprising an annular body disposed on a peripheral shoulder of the pedestal radially outward of the one or more purge gas inlets, the purge ring having an inner portion and an outer portion, wherein the inner portion has an upper inner notch that defines a first inner sidewall and inner upper wall of the annular body and a lower inner notch that defines a second inner sidewall and inner lower wall of the annular body, wherein a third inner sidewall is disposed between the first inner sidewall and the second inner sidewall, wherein the third inner sidewall is disposed radially inward of the first inner sidewall and the second inner sidewall, wherein a first height of the first inner sidewall is less than a second height of the second inner sidewall, wherein an inner diameter of the purge ring along the second inner sidewall increases from the third inner sidewall to a lowermost surface of the purge ring, and wherein the pedestal and the purge ring, together, define a gas flow path along the inner lower wall, third inner sidewall, and inner upper wall of the purge ring.

16. The substrate support of claim 15, wherein a gap between the third inner sidewall and an outer surface of the pedestal is about 0.01 to about 0.04 inches, and a gap between the inner lower wall and the pedestal is about 0.01 to about 0.04 inches.

17. The substrate support of claim 15, wherein the first height is less than a third height of the third inner sidewall.

18. The substrate support of claim 15, wherein the pedestal comprises a heater plate having one or more resistive heating elements disposed therein.

19. The substrate support of claim 15, further comprising:
a shadow ring disposed on the purge ring and extending over the upper inner notch, wherein an innermost diameter of the shadow ring is radially between the third inner sidewall and the first inner sidewall.

20. The substrate support of claim 19, wherein the purge ring includes a plurality of openings configured to receive alignment pins of the shadow ring to align the shadow ring with the purge ring.

\* \* \* \* \*